United States Patent
Benenati et al.

(10) Patent No.: US 6,358,627 B2
(45) Date of Patent: Mar. 19, 2002

(54) ROLLING BALL CONNECTOR

(75) Inventors: Joseph A. Benenati, Hopewell Junction, NY (US); Claude L. Bertin, South Burlington, VT (US); William T. Chen, Endicott, NY (US); Thomas E. Dinan, San Jose, CA (US); Wayne F. Ellis, Jericho; Wayne J. Howell, Williston, both of VT (US); John U. Knickerbocker, Hopewell Junction; Mark V. Pierson, Binghamton, both of NY (US); William R. Tonti; Jerzy M. Zalesinski, both of Essex Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/768,112

(22) Filed: Jan. 23, 2001

Related U.S. Application Data (62) Division of application No. 09/303,290, filed on Apr. 3, 1999, now Pat. No. 6,177,729.

(51) Int. Cl.$^7$ ............................................. H01L 21/44
(52) U.S. Cl. ........................ 428/612; 438/613; 438/666
(58) Field of Search ................................. 438/612, 613, 438/666

(56) References Cited

U.S. PATENT DOCUMENTS 5,795,818 A * 8/1998 Marrs
6,082,610 A * 7/2000 Shangguan et al.
6,163,463 A * 12/2000 Marrs

* cited by examiner

Primary Examiner—John F. Niebling
Assistant Examiner—Josetta Jones
(74) Attorney, Agent, or Firm—Robert A. Walsh (57) ABSTRACT

An integrated circuit assembly has pads of a chip electrically connected to pads of a substrate with rolling metal balls. A pliable material bonds the balls in movable contact with pads of the chip and substrate. Because the balls are relatively free to move, thermal expansion differences that would ordinarily cause enormous stresses in the attached joints of the prior art, simply cause rolling of the balls of the present invention, avoiding thermal stress altogether. Reliability of the connections is substantially improved as compared with C4 solder bumps, and chips can be safely directly mounted to such substrates as PC boards, despite substantial thermal mismatch.

7 Claims, 8 Drawing Sheets

ROLLING BALL CONNECTOR

This is a divisional application of Ser. No. 09/303,290, filed on Apr. 3, 1999, which has issued as U.S. Pat. No. 6,177,729 on Jan. 23, 2001.

FIELD OF THE INVENTION

This invention generally relates to electrical connectors for semiconductor components. More particularly, it relates to a connector between an integrated circuit chip and a substrate. Even more particularly, it relates to a connector that provides a high degree of relief from thermal stress to provide a very reliable joint between an integrated circuit chip or package and a thermal expansion mismatched substrate.

BACKGROUND OF THE INVENTION

Reliable interconnection of semiconductor integrated circuit chips and supporting substrates depends on avoiding stresses, including thermal expansion stresses, that can crack interconnects. Usually integrated circuits are mounted on supporting substrates made of material with a coefficient of thermal expansion that differs from the coefficient of thermal expansion of the material of the integrated circuit. For example, the integrated circuit may be formed of monocrystalline silicon with a coefficient of thermal expansion of $2.5 \times 10^{-6}$ per °C. and the supporting substrate may be formed of a ceramic material, such as alumina, with a coefficient of thermal expansion of $5.8 \times 10^{-6}$ per °C. In operation, the integrated circuit chip generates heat which raises the temperature of both the chip and the supporting substrate. Because of different temperatures and different coefficients of thermal expansion, the chip and substrate expand and contract different amounts. This difference in expansion imposes stresses on connections, such as the relatively rigid C4 solder bumps that are frequently used to provide an area array interconnection between a chip and a substrate. The stress on the solder bumps is directly proportional to (1) the magnitude of the temperature difference, (2) the distance of an individual bump from the neutral or central point of the solder bump array, and (3) the difference in the coefficients of thermal expansion of the material of the semiconductor device and the substrate, and inversely proportional to the height of the solder bond, that is the spacing between the IC chip and the support substrate.

Several factors are currently compounding the problem. As the solder bumps become smaller in diameter in order to accommodate the need for a greater density of interconnects between chip and substrate, the overall height of each solder bump decreases, reducing the fatigue life of the solder bumps. In addition, integrated circuit chip sizes are increasing which increases the distance of the outer solder bumps from the neutral point of the solder bump array, which in turn reduces the fatigue life of the solder bump. Furthermore, chips are now being directly mounted on substrates, such as PC boards, that have substantially larger coefficients of thermal expansion than ceramic, adding substantially to the stress on connectors. Thus, a better solution is needed that provides a way to reduce thermal stress and to provide a more reliable electrical connection, and this solution is provided by the following invention.

SUMMARY OF THE INVENTION

It is therefore an object of the present invention to provide a semiconductor assembly having connections with improved reliability.

It is another object of the present invention to provide a semiconductor assembly having connections that reduce thermal expansion mismatch stress and resist thermal fatigue and cracking due to thermal cycling.

It is another object of the present invention to provide an electrical connection between two substrates wherein a solid conductor in the connection is in substantially movable electrical contact with at least one of the substrates.

It is another object of the present invention to provide a pliable conductive material to facilitate the substantially movable conductor.

It is another object of the present invention to provide a movable conductor that can roll or slide.

It is another object of the present invention to provide a movable conductor that can stretch or bend a magnitude exceeding the elastic limit of a uniform metal.

It is a feature of one embodiment of the present invention that the movable contact is substantially elastic movement.

It is a feature of the present invention that the conductive material is an adhesive that bonds and provides electrical connection while permitting elastic movement of the movable conductor.

It is an advantage of the present invention that thermal stress is avoided despite large disparities in thermal expansion coefficient between chip and substrate.

It is an advantage of the present invention that a semiconductor assembly has good electrical connections while thermal stress is avoided despite large disparities in thermal expansion coefficient between chip and substrate.

These and other objects, features, and advantages of the invention are accomplished by providing a semiconductor assembly comprising a first substrate and a second substrate. The first substrate has a first contact pad and the second substrate has a second contact pad. In addition, the assembly includes a solid conductor and a material bonding the solid conductor wherein the solid conductor is in substantially movable contact with the first contact pad.

In one embodiment an integrated circuit chip has pads electrically connected to pads of a substrate through a metal ball and a pliable material. The pliable material bonds the metal ball in substantially movable contact with the pads. Because the ball is relatively free to move through the pliable material, thermal expansion differences that would ordinarily cause stress in an immovable joint simply cause the ball to roll across the pads as the chip and substrate freely expand or contract at their different rates. Thus, stress is avoided and reliability of the connection is substantially improved as compared with fixed connectors of the prior art.

BRIEF DESCRIPTION OF THE DRAWINGS

The foregoing and other objects, features, and advantages of the invention will be apparent from the following detailed description of the invention, as illustrated in the accompanying drawings, in which:

FIG. 5a is a cross sectional view and FIGS. 5b–5c three dimensional views showing the application of the present invention for chip or wafer burn-in.

DETAILED DESCRIPTION OF THE INVENTION

In one embodiment, the present invention provides an integrated circuit assembly in which pads of a first substrate are electrically connected to pads of a second substrate with rolling metal balls. A pliable material bonds the balls in movable contact with the pads. Because the balls are relatively free to move, thermal expansion differences that would ordinarily cause enormous stresses in the attached joints of the prior art, simply cause rolling of the balls of the present invention, avoiding stress altogether. Thus, reliability of the connections is substantially improved, and silicon chips can be safely directly mounted to such substrates as PC boards, despite substantial thermal expansion mismatch.

Figure 1:
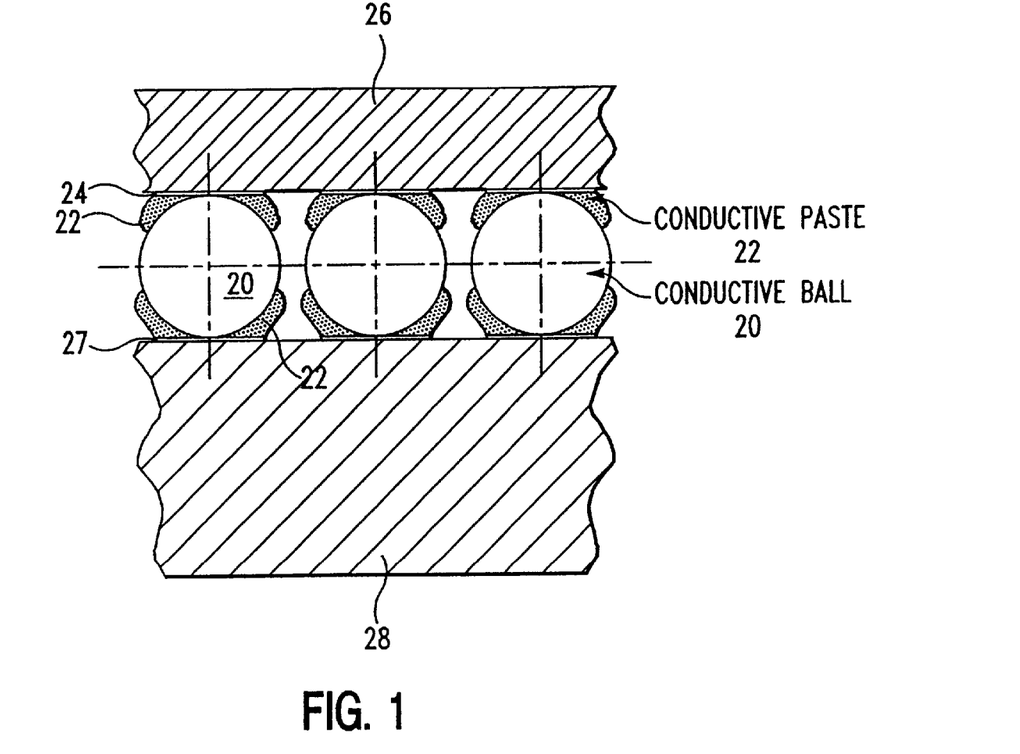
FIG. 1 is a cross sectional view showing a chip and substrate electrically connected by ball conductors and conductive paste.
Figure 2:
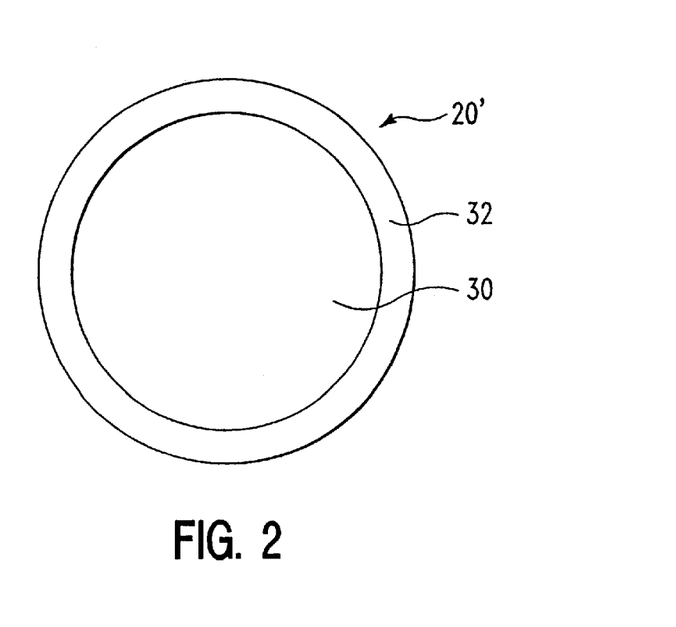
FIG. 2 is a cross sectional view of a ball conductor comprising a core and a highly conductive coating, the core comprising a base metal or a polymer, the highly conductive coating comprising a noble metal, such as gold.

Conductive ball 20 and conductive paste 22 are used to connect each pad 24 of chip 26 with pad 27 of substrate 28, as shown in FIG. 1. Conductive ball 20 preferably has a dimension approximately equal to the width of pad 24, the connection between pad 24 and pad 27, or the separation distance between pad 24 and pad 27, as shown in FIG. 1. Conductive ball 20 can be a solid metal ball, formed of a material such as gold or copper. Conductive ball 20' can also have a layered structure with base 30 and highly conductive coating 32 as shown in FIG. 2. Base 30 is formed of a base metal, such as copper, aluminum, or iron, or it can be formed of a polymer with significantly greater compliance than a metal or solder, such as silicone filled with particles of alumina or silica. The particles improve the mechanical properties of the ball, making it more stiff. Alternatively, base 30 can be formed of a metal filled polymer, such as silicone filled with gold, silver, or graphite. Although coating 32 is preferred, in this case it may not be necessary to provide a highly conductive coating. Highly conductive coating 32 is preferably a noble metal, such as gold, to avoid corrosion and provide low electrical resistance electrical contact, as is well known in the art. Conductive coating 32 can also be formed of copper, copper-nickel-gold, or another metal. Conductive coating 32 is provided with a thickness in the range from 200 A to 100 micrometers, more preferably in the range 0.5 to 5 micrometers.

Conductive paste 22 is formed of a material such as a metal filled conductive paste, for example, Polymer Metal Composite Paste (PMC) and Epo-tek, manufactured by Epoxy Technology. PMC is formed of a high temperature epoxy filled with a metal, such as gold. PMC has an resistivity of 10–30 micro-ohm-cm. and a viscosity of 75,000 to 200,000 $P_S$.

Conductive paste 22 makes electrical contact with pad 24, pad 27, and with conductive ball 20. While continuing to maintain electrical contact with paste 22, conductive ball 20 can roll or otherwise move through conductive paste 22. Preferably, paste 22 wets to ball 20 and maintains this wetting contact to ball 20 as ball 20 moves. Thus, electrical connection between pads 24 and 26 is maintained through paste 22 and ball 20 while chip 26 moves laterally with respect to substrate 28 in response to differential thermal expansion forces. Ball 20 rolls as chip 26 and substrate 28 move. In addition to providing improved reliability with respect to thermal expansion, this embodiment of the invention also provides advantage in that chips are mounted face down without the use of lead containing solder, avoiding a source of alpha particles that can cause soft errors while chip 26 is operating.

Figure 3A:
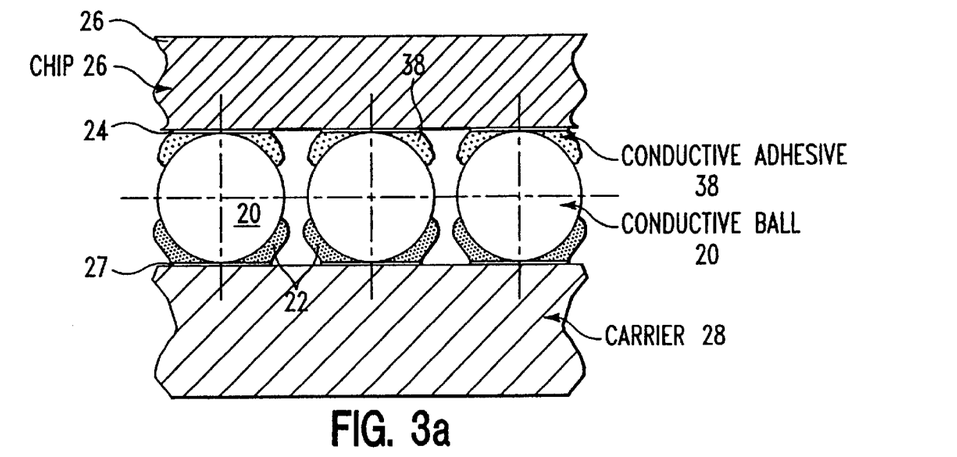
FIG. 3a is a cross sectional views of an alternate embodiment in which the ball conductor has conductive paste on one side and a stable fillet on the other side, the stable fillet being solder or a cured conductive adhesive.

While providing paste 22 on both sides of ball 20 allows free movement for both chip 26 and substrate 28 as ball 20 moves through paste 22, substantial movement and stress-free results can also be achieved by providing conductive paste 22 on only one side of ball 20. Stable fillet 38, such as solder or cured conductive adhesive is used on the other side, as shown in FIG. 3a. Conductive adhesives include cured PMC and cured Epo-tek. In the case illustrated in FIG. 3a, conductive ball 20 is fixed to chip 26 with stable fillet 38 while conductive paste is provided between ball 20 and substrate 28. Of course, the roles of chip 26 and substrate 28 can be reversed, and stable fillet 38 can be applied on the side of substrate 28 while paste 22 is applied on the side of chip 26.

Figure 3B:
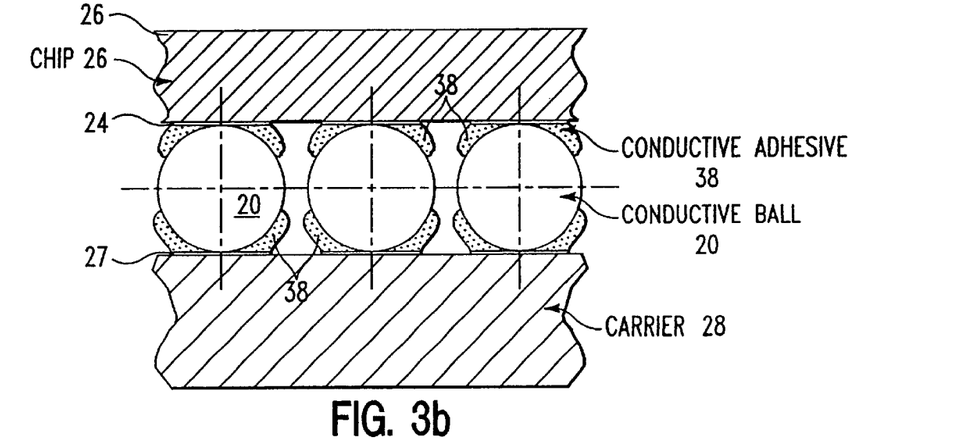
FIG. 3b is a cross sectional views of another embodiment in which the ball conductor has stable fillets on both sides, the stable fillet being solder or a cured conductive adhesive.
Figure 3C:
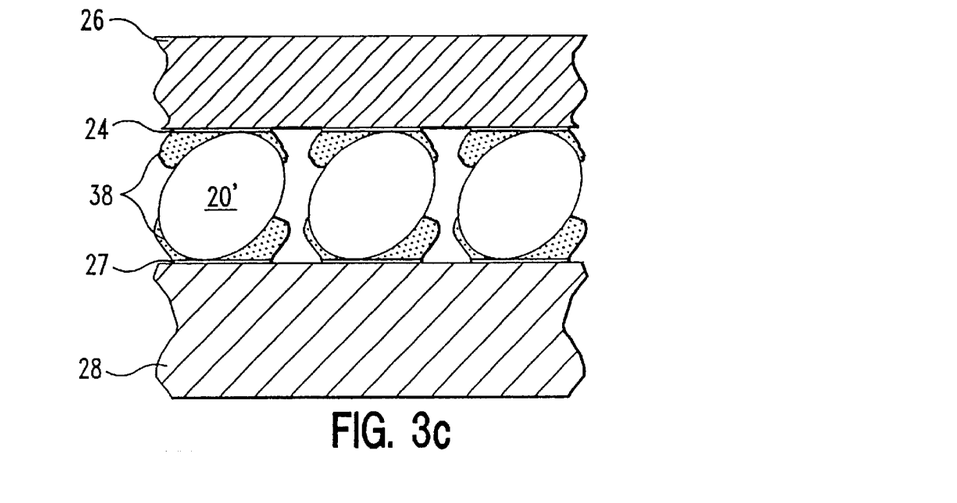
FIG. 3c is are a cross sectional view of the embodiment of FIG. 3b in a stretched configuration in response to differential thermal expansion of chip and substrate.

Furthermore, if ball 20, 20' is sufficiently compliant for the size of chip 26, temperature range, and height, stable fillets 38 can be provided on both sides, as shown in FIG. 3b. The ability of ball 20' to stretch accommodates differential thermal expansion, as shown in FIG. 3c. Gold coated polymer ball 20' provides enormous compliance compared with standard metal ball 20 or standard lead-tin solder bumps. Alternatively, gold coated polymer ball 20' can be replaced with a gold coated polymer column to further improve reliability. Thus, in many applications, rolling or sliding of ball 20 can be replaced with stretching or bending of gold coated polymer ball 20', as shown in FIG. 3c. Because of the enormously greater stretching permitted by polymer ball 20' as compared with metal ball 20 or a C4 solder bump, a connector formed with polymer ball 20' is considered to provide a substantially movable contact there between. Ball 20' can now be attached on both sides with stable fillets 38, such as solder or a cured adhesive while still providing a substantially low-stress, flexible contact. Because of the enormous elastic flexibility of polymer ball 20', chip 26 and substrate 28 still have substantial freedom to move, the movement stretching gold coated polymer ball 20' without exceeding its elastic limit. Stable fillets 38 on either side of polymer ball 20' have advantage in that they provide a strong permanent mechanical connection of chip 26 with substrate 28.

Figure 4A:
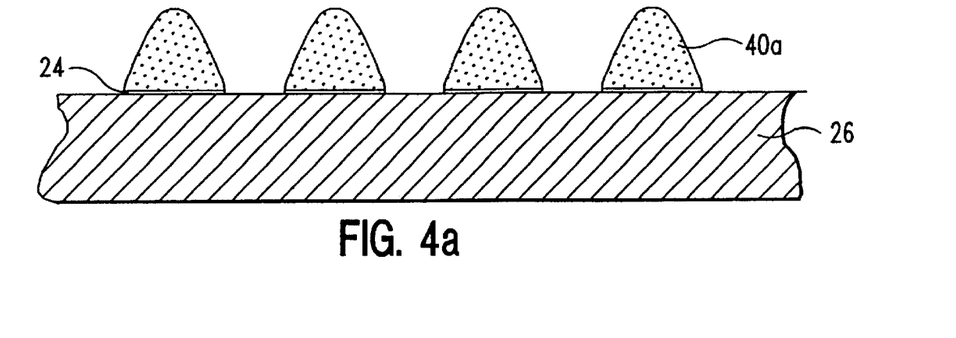
FIGS. 4a–4c are cross sectional views illustrating the steps of fabricating the connection of FIG. 1.
Figure 4B:
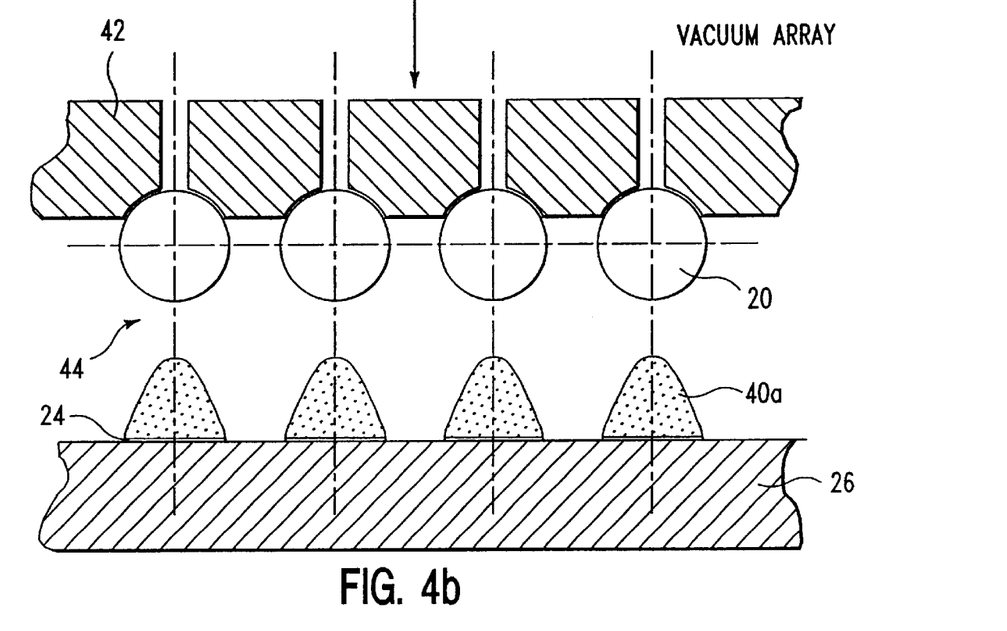
Figure 4C:
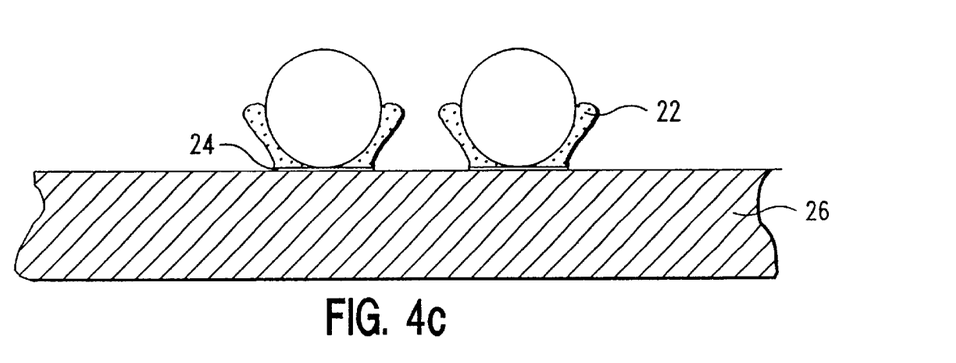

Steps in fabrication of the assembly are illustrated in FIGS. 4a–4c. In the first step, conductive paste deposit 40a, is applied to each pad 24 of chip 26, as shown in FIG. 4a. Similarly, a conductive paste deposit is applied to each pad of substrate 28 (not shown). In the next step, vacuum holder 42 is used to pick up array 44 of balls 20 corresponding to the location of pads 24 and 27 on chip 26 and substrate 28. Array 44 of balls 20 is pushed down into paste deposits 40a, as shown in FIG. 4c, on chip 26 and vacuum is released, providing balls 20 in electrical connection with compressed paste 22, which in turn is electrically connected to pad 24. In the next step, substrate 28, also having paste deposits, is aligned and pressed down on balls 20, as shown in FIG. 1. The mechanical and electrical connection between chip 26 and substrate 28 through ball 20 and paste 22 on either side of ball 20 is now complete. Alternatively, array 44 of balls 20 can first be mounted on substrate 28, and chip 24 mounted thereon.

A fabrication technique similar to that illustrated in FIGS. 4a–4c can be used to provide a stable fillet on one or both sides of solder ball 20. Stable fillets include conductive polymeric adhesive, conductive epoxy, and solder. In this case, a curing step or elevated temperature reflow step is provided after the ball has been inserted in the deposit of conductive material shown in FIG. 4c. For the embodiment of the invention having cured epoxy on both sides of ball 20, a single curing step can be used to cure the epoxy on both sides. Solder paste can be used to provide solder fillets on one or both sides of ball 20, and in this case, an elevated temperature reflow is used in place of a cure.

Figure 5A:
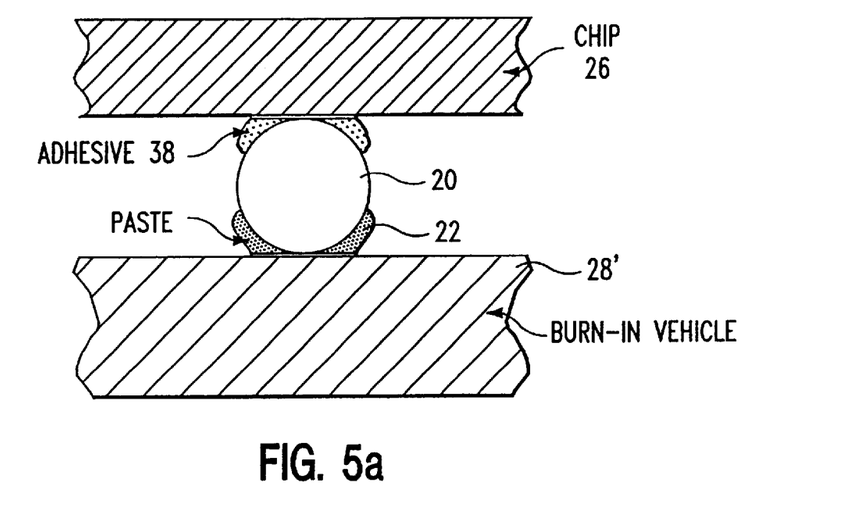
Figure 5B:
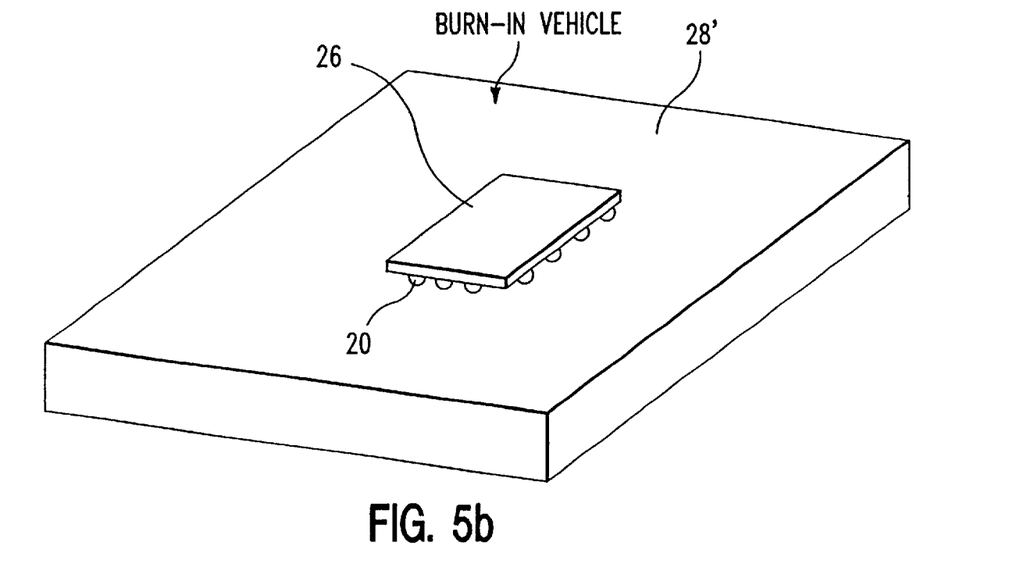
Figure 5C:
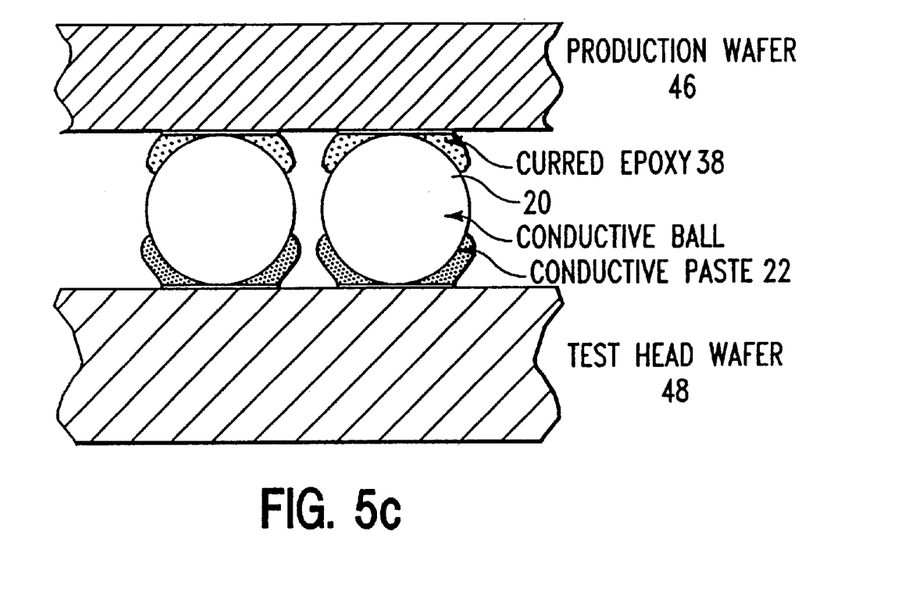
Figure 5D:
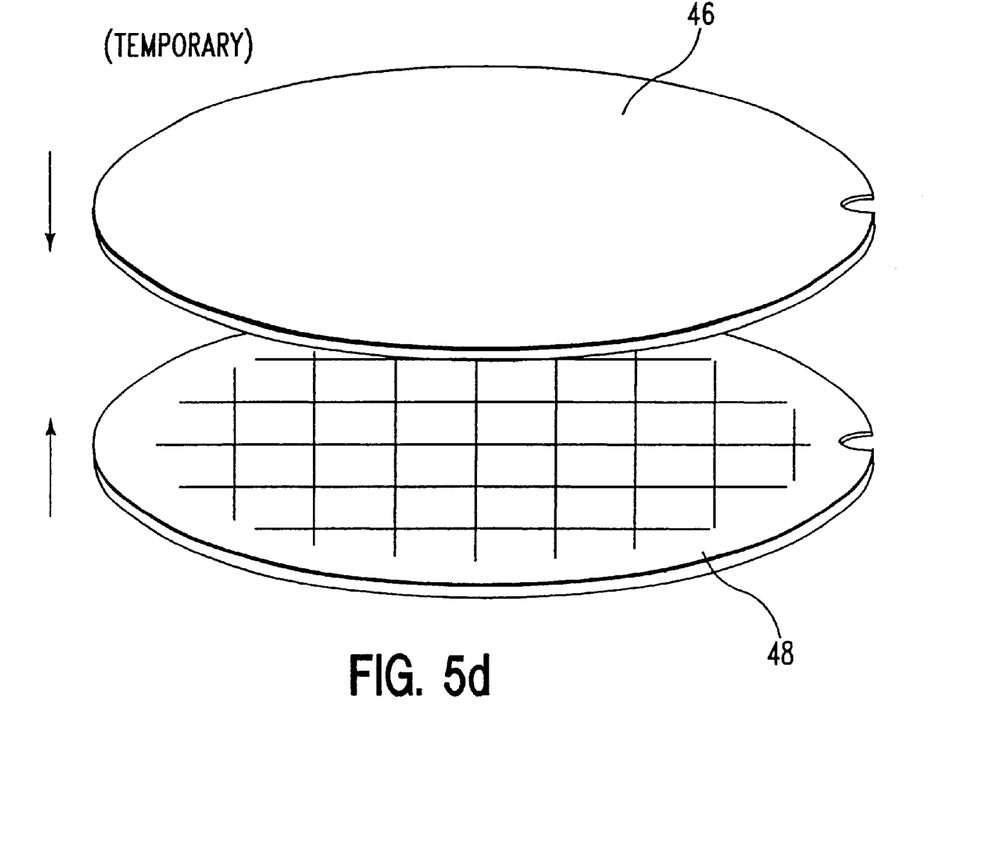

The present invention is applicable for temporary chip attach for test and burn-in, as shown in FIGS. 5a–5d. Individual chips 26 are temporarily mounted on test and burn-in substrates 28' with the ball 20 and conductive paste 22 connectors of the present invention, as shown in FIGS. 5a and 5b. Similarly, entire wafer 46 is mounted on a temporary test head 48 with the ball 20 and conductive paste 22 connectors of the present invention, as shown in FIGS. 5c and 5d. Expansion differences as temperature changes for elevated temperature test or burn-in are accommodated by the movable contacts. After testing and burning-in of chips 26 or wafer 46 is complete, chips 26 or wafer 46 can be removed from test and burn-in substrates 28' or test head 48. Conductive paste 22 permits disassembly after test and burn-in are complete without any damage to chip 26 and substrate 28 or to wafer 46 and test head 48.

Figure 6A:
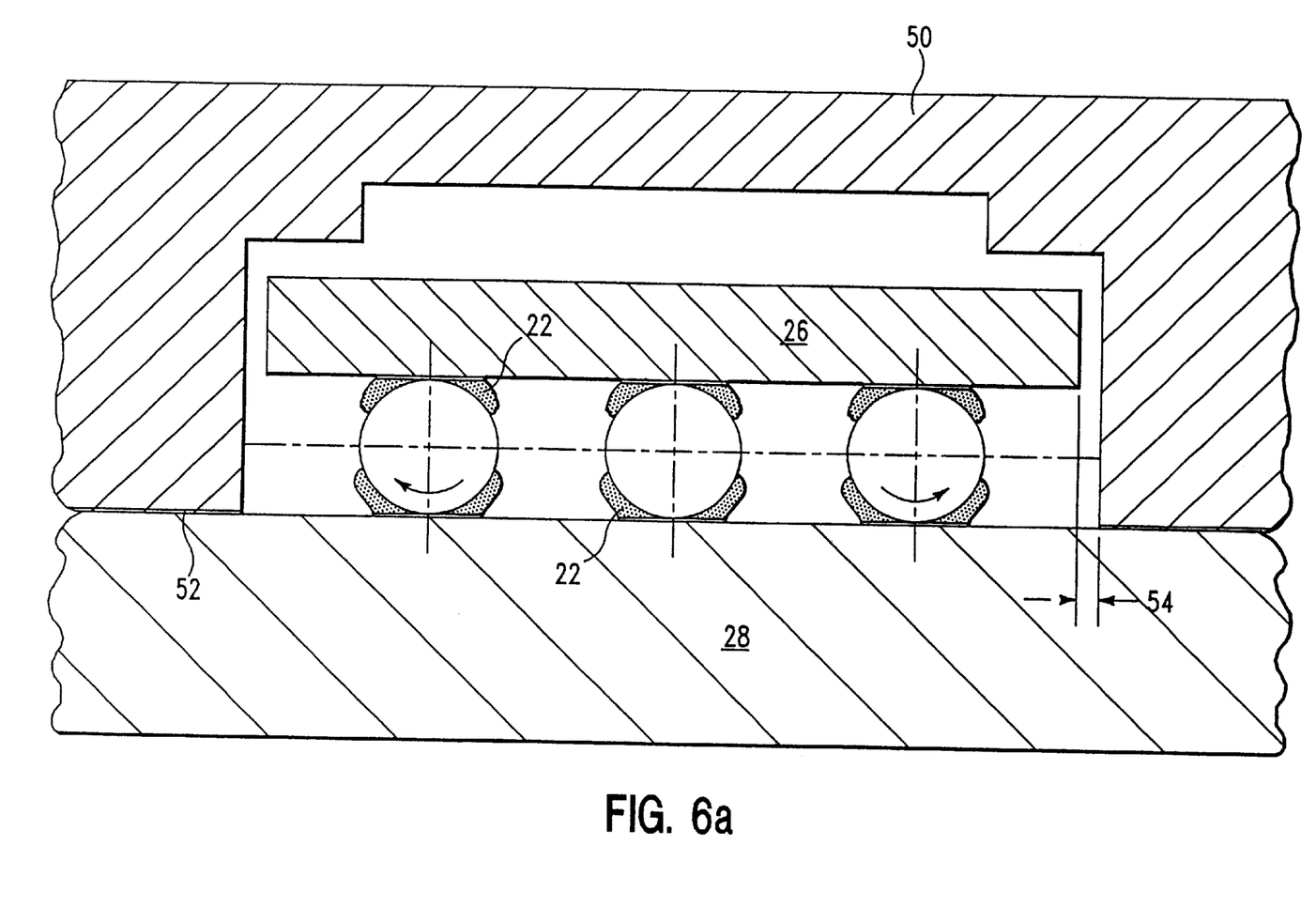
FIG. 6a is a cross sectional view showing an embodiment of the invention in which a frame adds mechanical strength.
Figure 6B:
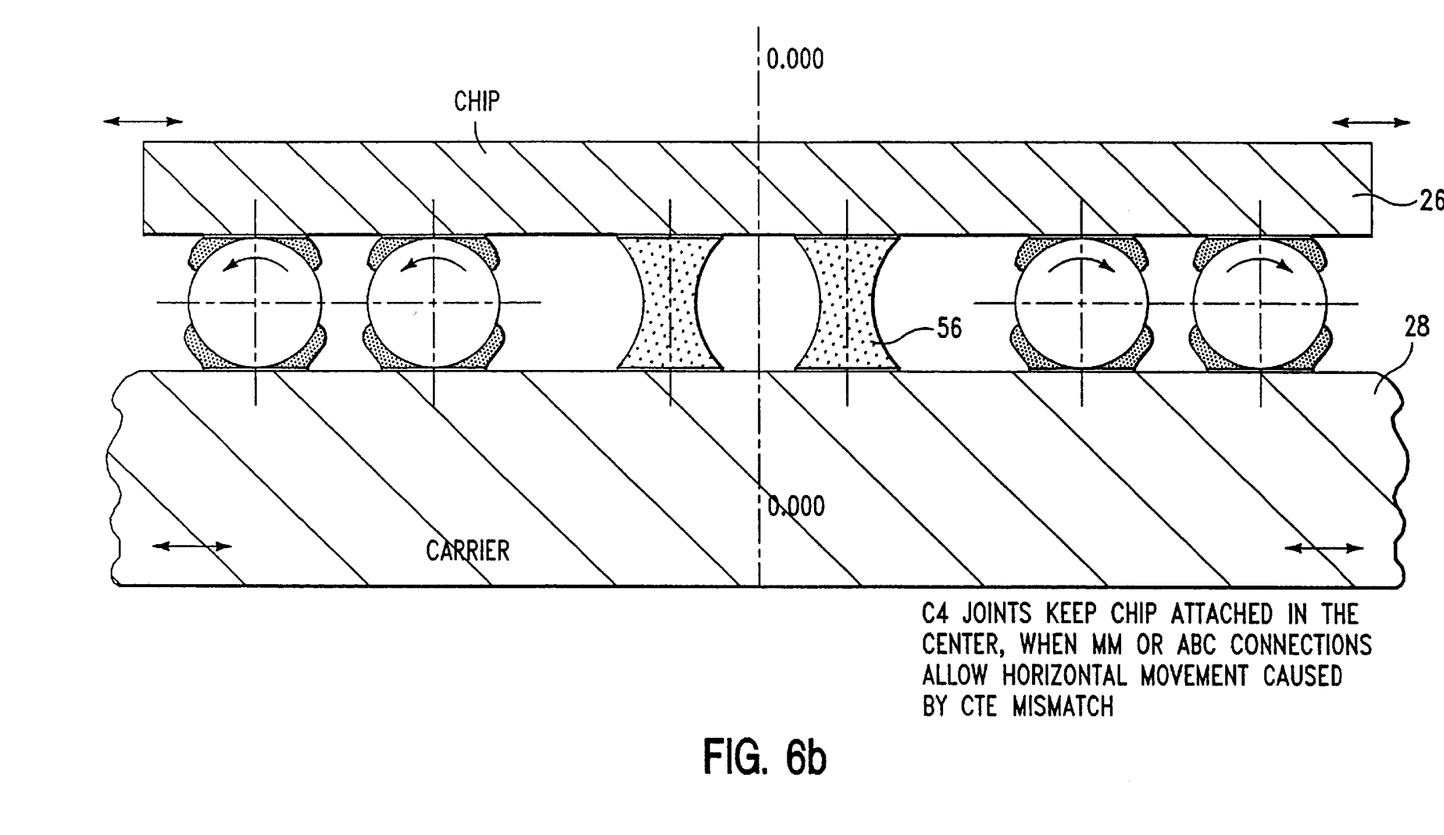
FIG. 6b is a cross sectional view showing an embodiment of the invention in which stable fillets, such as C4 solder bumps or cured adhesive, add mechanical strength.

While adhesive properties of paste 22 are sufficient to hold chip 26 in place on substrate 28, mechanical hold-down 50 can also be used, as shown in FIG. 6a to prevent excessive movement of chip 26. Mechanical hold-down 50 is connected to substrate 28 with adhesive or solder layer 52. Space 54 is provided, permitting the small amount of lateral movement of chip 26 needed to accommodate thermal expansion while mechanical hold-down 50 prevents vertical movement. Mechanical hold-down 50 can also serve to electrically shield chip 26 and to provide a heat sink for chip 26. In an alternative embodiment, substantially fixed contacts, such as C4 solder bumps or cured conductive adhesive 56, is used near neutral point 0.000 (or center) of chip 26, providing certain mechanical connection, while rolling ball connectors 20, 20' are used toward the perimeter of chip 26 to accommodate differential thermal expansion between chip and substrate, as shown in FIG. 6b.

Figure 7:
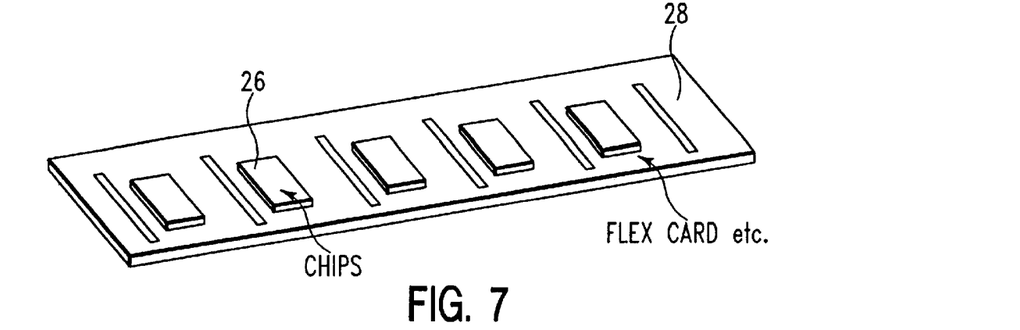
FIG. 7 is a three dimensional view showing chips mounted on cards according to the present invention.

Multiple chips connected with movable connectors of the present invention can be provided on a single substrate, as shown in FIG. 7. Substrate 28 can be a card, flex, ceramic substrate, lead frame, or any other substrate.

Figure 8:
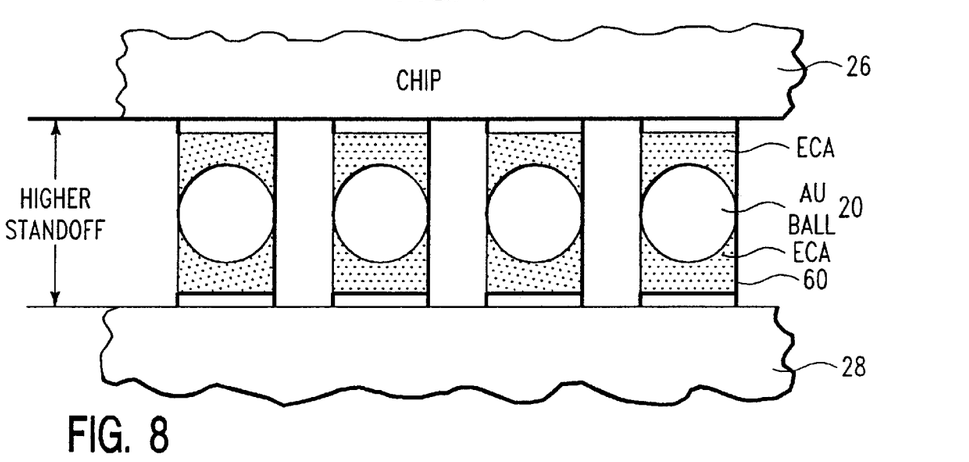
FIG. 8 is a cross sectional view showing an alternate embodiment of the invention in which conductive adhesive is formed as columns, the ball conductor being embedded in each column.

In addition to stable fillets, conductive adhesive can be formed as columns, 60 as shown in FIG. 8, to provide a higher standoff and more reliable joint. Conductive ball 20 serves to stiffen column 60 permitting column 60 to taller. Column 60 is formed of electrically conductive adhesive (ECA), such as polymer metal composite paste, an epoxy filled with metal particles, as described herein above. The ECA is first deposited on substrate 28. Then an array of balls is placed with a technique such as vacuum suction cups. ECA is also deposited on matching pads for chip 26 and the chip is aligned and placed on substrate 28.

Figure 9A:
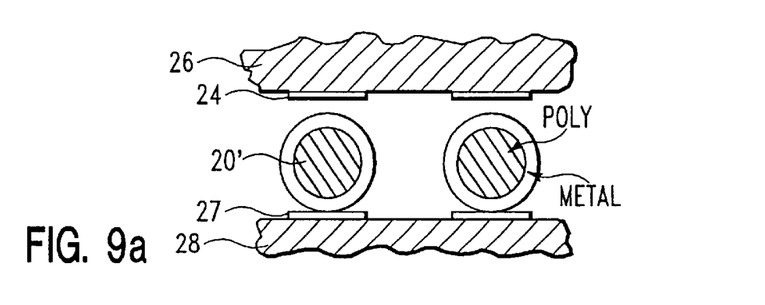
FIGS. 9a and 9b are cross sectional views showing an alternate embodiment of the invention in which a plurality of ball conductors comprising a core and a highly conductive coating are deformed during mounting to ensure connection to all ball conductors.
Figure 9B:
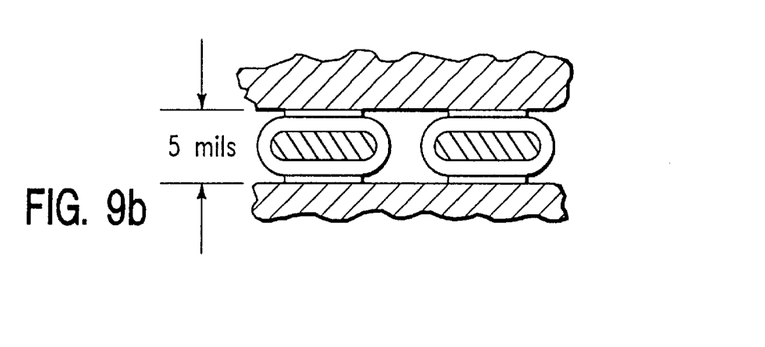

In an alternate embodiment, polymer ball 20' of FIG. 2 is provided as shown in FIG. 9a, and then compressed and deformed during mounting, as shown in FIG. 9b, ensuring a good connection as height mismatch among pads is accommodated. Pads 24, 27 are formed of multilevel thin films comprising copper and nickel. The pad surfaces are first roughened by plating palladium dendrites on the nickel pads, as is well known in the art. After ball 20' is placed between chip pad 24 and substrate pad 27, mechanical force is provided against the roughened pad surfaces to create a reliable interconnection. This technique can be used for a reliable chip-substrate connection or a substrate-printed wiring board connection. Alternatively solder can be used to provide connection between deformable polymer ball 20' and pads 24, 27. Polymer ball 20' can also be configured in a shape, such as a column, to increase height and further improve reliability.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method of fabricating an assembly, comprising the steps of:
   (a) providing a first substrate and a second substrate, said first substrate having a first contact pad, said second substrate having a second contact pad;
   (b) providing a first material on said first contact pad;
   (c) providing a solid conductor on said first material, said solid conductor having a dimension about equal to a dimension of the contact;
   (d) providing a second material on said second substrate; and
   (e) bonding said second substrate to said solid conductor, wherein said solid conductor is in substantially movable electrical contact with said first contact pad after fabrication is complete.

2. A method of fabricating as recited in claim 1, wherein said first substrate comprises a burn-in substrate and said second substrate comprises a chip and wherein said method further comprises the step of burning in said chip.

3. A method of fabricating as recited in claim 2, further comprising the step of removing said chip from said substrate and mounting said burned-in chip in a final package.

4. A method of fabricating as recited in claim 1, wherein said first substrate comprises a temporary test head and said second substrate comprises a wafer and wherein said method further comprises the step of burning-in said wafer.

5. A method of fabricating as recited in claim 4, further comprising the step of removing said wafer from said test head, dicing said burned-in wafer into chips, and mounting said burned-in chip into final packages.

6. A method of fabricating as recited in claim 1, wherein said first and second substrates each have an array of contact pads and said providing step (c) comprises providing an array of solid conductors simultaneously, one for each contact pad.

7. A method of fabricating as recited in claim 6, wherein said providing step (c) comprises providing each said conductor of said array of solid conductors with a vacuum device having an array of vacuum ports.

* * * * *